United States Patent
Lee et al.

(10) Patent No.: US 9,848,492 B2
(45) Date of Patent: Dec. 19, 2017

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Jae-Ean Lee, Busan-si (KR); Jee-Soo Mok, Yongin-si (KR); Young-Gwan Ko, Seoul (KR); Soon-Oh Jung, Yongin-si (KR); Kyung-Hwan Ko, Gimhae (KR); Yong-Ho Baek, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/139,698

(22) Filed: Apr. 27, 2016

(65) Prior Publication Data

US 2016/0374197 A1  Dec. 22, 2016

(30) Foreign Application Priority Data

Jun. 18, 2015  (KR) .................. 10-2015-0086883

(51) Int. Cl.
| | |
|---|---|
| *H05K 1/09* | (2006.01) |
| *H05K 1/02* | (2006.01) |
| *H05K 1/11* | (2006.01) |
| *H05K 3/46* | (2006.01) |
| *H05K 3/06* | (2006.01) |
| *H05K 3/18* | (2006.01) |
| *H05K 3/40* | (2006.01) |
| *H05K 1/18* | (2006.01) |

(52) U.S. Cl.
CPC .......... *H05K 1/0298* (2013.01); *H05K 1/111* (2013.01); *H05K 1/183* (2013.01); *H05K 3/06* (2013.01); *H05K 3/061* (2013.01); *H05K 3/188* (2013.01); *H05K 3/40* (2013.01); *H05K 3/4644* (2013.01); *H05K 2201/09036* (2013.01)

(58) Field of Classification Search
CPC ... H05K 1/02; H05K 1/03; H05K 1/11; H05K 1/16; H05K 1/18; H05K 3/02; H05K 3/30; H05K 3/40; H01L 21/00; H01L 21/44; H01L 21/48; H01L 21/50; H01L 21/58; H01L 23/24; H01L 23/48; H01L 23/49; H01L 23/52; H01L 23/53
USPC ................ 174/251, 250, 255–257, 260–262; 361/760–762; 428/209; 438/121, 124; 257/620, 686, 698, 738
See application file for complete search history.

(56) References Cited

U.S. PATENT DOCUMENTS

| | | | | |
|---|---|---|---|---|
| 5,306,670 | A | * 4/1994 | Mowatt ............... | H01L 23/5383 257/E23.172 |
| 5,597,643 | A | * 1/1997 | Weber ................. | H01L 21/4857 174/255 |

(Continued)

*Primary Examiner* — Xiaoliang Chen
(74) *Attorney, Agent, or Firm* — NSIP Law

(57) ABSTRACT

A printed circuit board includes: an insulating layer including a cavity formed therein, the cavity being recessed into the insulating layer from a top surface of the insulating layer; a first circuit layer formed inside the insulating layer such that a portion of the first circuit layer is disposed within the cavity; a second circuit layer disposed above the insulating layer; a first surface-treated layer disposed above the portion of the first circuit layer disposed within the cavity; and a second surface-treated layer disposed above the second circuit layer.

4 Claims, 13 Drawing Sheets

(56) References Cited

U.S. PATENT DOCUMENTS

| | | | | |
|---|---|---|---|---|
| 5,622,588 | A * | 4/1997 | Weber | H01L 21/4803 156/150 |
| 6,400,573 | B1 * | 6/2002 | Mowatt | H01L 23/5383 174/252 |
| 7,886,433 | B2 * | 2/2011 | Bae | B32B 3/06 29/830 |
| 8,472,207 | B2 * | 6/2013 | Rendek, Jr. | H05K 1/186 174/255 |
| 8,872,041 | B2 * | 10/2014 | Lee | H05K 1/186 174/250 |
| 9,282,626 | B2 * | 3/2016 | Yoo | H05K 1/02 |
| 9,449,943 | B2 * | 9/2016 | Lin | H01L 21/568 |
| 2001/0052647 | A1 * | 12/2001 | Plepys | H01L 21/50 257/738 |
| 2002/0158334 | A1 * | 10/2002 | Vu | H01L 23/16 257/723 |
| 2002/0173133 | A1 * | 11/2002 | Towle | H01L 24/03 438/612 |
| 2004/0178510 | A1 * | 9/2004 | Sunohara | H01L 23/481 257/781 |
| 2005/0046039 | A1 * | 3/2005 | Yang | H01L 23/24 257/778 |
| 2005/0253244 | A1 * | 11/2005 | Chang | H01L 21/6835 257/692 |
| 2006/0051895 | A1 * | 3/2006 | Abe | H01L 21/563 438/108 |
| 2006/0115931 | A1 * | 6/2006 | Hsu | H01L 24/24 438/121 |
| 2006/0128069 | A1 * | 6/2006 | Hsu | H01L 23/5389 438/124 |
| 2006/0237225 | A1 * | 10/2006 | Kariya | H01L 23/49827 174/260 |
| 2007/0025092 | A1 * | 2/2007 | Lee | H01L 23/49822 361/761 |
| 2008/0006942 | A1 * | 1/2008 | Park | H01L 25/105 257/738 |
| 2008/0049405 | A1 * | 2/2008 | Sahara | H05K 1/183 361/761 |
| 2008/0128865 | A1 * | 6/2008 | Chia | H01L 23/49816 257/620 |
| 2009/0315194 | A1 * | 12/2009 | Lee | H01L 21/561 257/797 |
| 2010/0000775 | A1 * | 1/2010 | Shen | H01L 23/3128 174/260 |
| 2010/0019368 | A1 * | 1/2010 | Shin | H01L 23/24 257/686 |
| 2010/0132995 | A1 * | 6/2010 | Kaneko | H01L 21/6835 174/261 |
| 2010/0147560 | A1 * | 6/2010 | Kaneko | H01L 23/13 174/250 |
| 2010/0157583 | A1 * | 6/2010 | Nakajima | H01L 25/0753 362/184 |
| 2010/0170700 | A1 * | 7/2010 | Nakamura | H05K 1/183 174/254 |
| 2010/0206621 | A1 * | 8/2010 | Wada | H05K 1/186 174/256 |
| 2010/0320622 | A1 * | 12/2010 | MacHida | H01L 23/49822 257/778 |
| 2011/0240357 | A1 * | 10/2011 | Kariya | H01L 23/5389 174/266 |
| 2012/0061833 | A1 * | 3/2012 | Jeong | H01L 23/5389 257/738 |
| 2012/0181074 | A1 * | 7/2012 | Ishihara | H05K 3/4691 174/261 |
| 2013/0189935 | A1 * | 7/2013 | Nair | H01Q 1/38 455/90.2 |
| 2015/0083476 | A1 * | 3/2015 | Kim | H05K 1/113 174/260 |
| 2015/0102484 | A1 * | 4/2015 | Chen | H01L 23/3121 257/737 |
| 2016/0081182 | A1 * | 3/2016 | Kang | H01L 25/105 361/803 |
| 2016/0081191 | A1 * | 3/2016 | Mok | H05K 3/4697 174/257 |
| 2016/0141235 | A1 * | 5/2016 | Lin | H05K 3/4644 361/760 |
| 2016/0233166 | A1 * | 8/2016 | Teh | H01L 24/19 |
| 2016/0322332 | A1 * | 11/2016 | Kim | H01L 23/16 |

* cited by examiner

PRINTED CIRCUIT BOARD AND METHOD OF MANUFACTURING THE SAME

CROSS-REFERENCE TO RELATED APPLICATION(S)

This application claims the benefit under 35 USC 119(a) of Korean Patent Application No. 10-2015-0086883, filed on Jun. 18, 2015 in the Korean Intellectual Property Office, the entire disclosure of which is incorporated herein by reference for all purposes.

BACKGROUND

1. Field

The following description relates to a printed circuit board and a method of manufacturing the same.

2. Description of Related Art

Meeting with technical requirements associated with mobile phones and other electronic apparatuses in the field of information technology that have become increasingly multi-functional, lighter, thinner and smaller, there have been heightened demands for inserting integrated circuits, semiconductor chips or various electronic elements, such as active devices and passive devices, in a board. Recently, various methods of embedding a component in a board have been developed.

A typical component-embedded board has a cavity formed in an insulating layer of the board and has various components, integrated circuits and/or semiconductor chips inserted in the cavity. U.S. Pat. No. 7,886,433 describes an example of a method of manufacturing a component-embedded printed circuit board.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a printed circuit board includes: an insulating layer including a cavity formed therein, the cavity being recessed into the insulating layer from a top surface of the insulating layer; a first circuit layer formed inside the insulating layer such that a portion of the first circuit layer is disposed within the cavity; a second circuit layer disposed above the insulating layer; a first surface-treated layer disposed above the portion of the first circuit layer disposed within the cavity; and a second surface-treated layer disposed above the second circuit layer.

The first surface-treated layer may be constructed of a material that does not react with an etchant that reacts with the second circuit layer.

The printed circuit board may further include a first protective layer disposed above the insulating layer within the cavity and surrounding and protecting the first circuit layer, wherein the first protective layer is formed to expose an upper surface of the first surface-treated layer to an outside environment.

The printed circuit board may further include a first protective layer disposed above the insulating layer within the cavity and between a lateral surface of the second insulating layer and a lateral surface of the first circuit layer.

The printed circuit board may further include a second protective layer disposed above the insulating layer and surrounding and protecting the second circuit layer, wherein the second protective layer is formed to expose an upper surface of the second surface-treated layer to an outside environment.

The portion of the first circuit layer disposed in the cavity may form connection pads configured to be electrically connected with an electronic component to be mounted thereon.

According to another general aspect, a method of manufacturing a printed circuit board includes: forming a first circuit layer above a first insulating layer such that a portion of the first circuit layer is disposed in a cavity area of the first insulating area and is exposed to an outside environment; forming a first surface-treated layer above the portion of the first circuit layer disposed in the cavity area; forming a second insulating layer above the first insulating layer, the second insulating layer including a cavity formed at a portion thereof corresponding to the cavity area; forming a second circuit layer above the second insulating layer; and forming a second surface-treated layer above the second circuit layer.

The method may further include, prior to the forming of the first surface-treated layer, forming a first protective layer above the first insulating layer in the cavity area, wherein the first protective layer is formed to surround the portion of the first circuit layer disposed in the cavity area and to expose a portion of an upper surface of the first circuit layer to the outside environment.

The method may further include, after the forming of the first surface-treated layer, forming a first protective layer above the first insulating layer in the cavity area, wherein the first protective layer is formed between a lateral surface of the second insulating layer and a lateral surface of the first circuit layer.

The forming of the first surface-treated layer may include constructing the first surface-treated layer of a material that does not react with an etchant reacting with the second circuit layer.

The forming of the second circuit layer may include forming the second circuit layer using a tenting method.

The forming of the second insulating layer includes laminating the second insulating layer having the cavity formed therein and a metal foil covering an upper part of the second insulating layer including the cavity above the first insulating layer.

The forming of the second circuit layer may include: forming a plated layer above the metal foil by performing electroplating; forming an etching resist patterned to expose the second circuit layer and a portion corresponding to the cavity; removing portions of the metal foil exposed by the etching resist and the plated layer by use of an etchant; and removing the etching resist.

The method may further include, prior to the forming of the second surface-treated layer, forming a second protective layer above the second insulating layer, wherein the second protective layer is formed to surround the second circuit layer and to expose an upper surface of a portion of the second circuit layer to the outside environment.

The forming of the second surface-treated layer may include forming the second surface-treated layer on the upper surface of the portion of the second circuit layer exposed to the outside by the second protective layer.

The may further include: forming a plated resist above the first circuit layer within the cavity, prior to the forming of the second surface-treated layer; and removing the plated resist, after the forming of the second surface-treated layer.

The portion of the first circuit layer disposed in the cavity area may form connection pads configured to be electrically connected with an electronic component to be mounted thereon.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Figure 1:
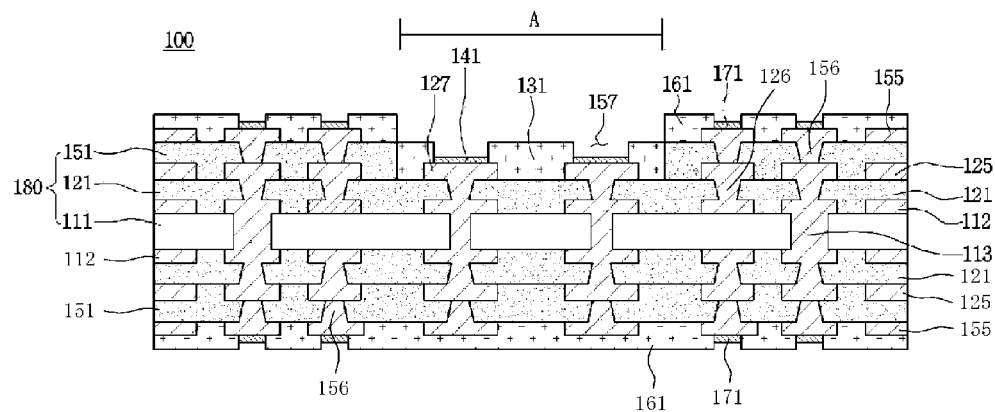
FIG. 1 illustrates an example of a printed circuit board.

FIG. 1 illustrates an example of a printed circuit board 100 according to an embodiment.

Referring to FIG. 1, the printed circuit board 100 includes an insulating layer 180, upper and lower inner circuit layers 112, upper and lower first circuit layers 125, upper and lower second circuit layers 155, a first surface-treated layer 141, upper and lower second surface-treated layers 171, a first protective layer 131, and upper and lower second protective layers 161.

The insulating layer 180 includes a core insulating layer 111, upper and lower first insulating layers 121, and upper and lower second insulating layers 151. The upper first insulating layer 121 and the upper second insulating layer 151 are successively laminated above the core insulating layer 111. The lower first insulating layer 121 and the lower second insulating layer 151 are successively laminated below the core insulating layer 111.

According to an embodiment, the core insulating layer 111, the first insulating layers 121 and the second insulating layers 151 are constructed of a composite polymer resin that is commonly used for an interlayer insulating material. For instance, the core insulating layer 111 and the first insulating layers 121 may be constructed of an epoxy resin, for example, a prepreg, an ajinomoto build-up film (ABF), flame retardant 4 (FR-4) or bismaleimide triazine (BT). However, the material forming the core insulating layers 111 and the first insulating layers 121 is not restricted to what is described herein and may be selected among insulating materials known in the field of circuit boards. In an embodiment, the second insulating layers 151 are constructed of a no-flow prepreg.

The upper second insulating layer 151 has a cavity 157 formed therein. The cavity 157 has a structure penetrating the upper second insulating layer 151. A portion of the first circuit layer 125 is disposed in the cavity 157. Accordingly, the upper second insulating layer 151 is formed such that a portion of the upper first circuit layer 125 formed above the upper first insulating layer 121 is embedded therein.

The upper and lower inner circuit layers 112 are respectively formed above and below the core insulating layer 111. The inner circuit layers 112 are constructed of a conductive material. For instance, the inner circuit layers 112 may be constructed of copper or another conductive material known in the field of circuit boards.

The printed circuit board 100 further includes a through-via 113 formed to penetrate the core insulating layer 111. The through-via 113 electrically connects the upper inner circuit layer 112 with the lower inner circuit layer 112. The through-via 113 is constructed of a conductive material. For instance, the through-via 113 may be constructed of copper or another conductive material known in the field of circuit boards.

The upper first circuit layer 125 is formed above the upper first insulating layer 121. The lower first circuit layer 125 is formed below the lower first insulating layer 121. Upper first vias 126 connect the upper first circuit layer 125 to the upper inner circuit layer 112. Lower first vias 126 connect the lower first circuit layer 125 to the lower inner circuit layer 112. The first circuit layers 125 and the first vias 126 may be constructed of copper, or another conductive material known in the field of circuit boards.

A portion of the upper first circuit layer 125 is disposed in the cavity 157. Moreover, the portion of the upper first circuit layer 125 that is placed in the cavity 157 includes connection pads 127. According to an embodiment, the connection pads 127 are elements that are electrically connected with an electronic component (not shown), which is later mounted on the connection pads 127.

The upper second circuit layer 155 is formed above the upper second insulating layer 151. In addition, the lower second circuit layer 155 is formed below the lower second insulating layer 151. The second circuit layers may be constructed of copper, or another conductive material known in the field of circuit boards.

The first surface-treated layer 141 is formed above the connection pads 127 of the upper first circuit layer 125. Referring to FIG. 1, the first surface-treated layer 141 is not formed throughout an upper face of the connection pads 127 but is formed on only a portion of the upper face of the connection pads 127. The first surface-treated layer 141 functions to protect the connection pads 127 from the outside environment. Moreover, the first surface-treated layer 141 prevents the connection pads 127 from being oxidized and corroded.

The first surface-treated layer 141 is constructed of a conductive material that is different from the material of the upper second circuit layer 155, and that does not react with an etchant that reacts with the upper second circuit layer 155. For example, the first surface-treated layer 141 may include at least one of electroless nickel immersion gold (ENIG), nickel, palladium, gold, tin, lead-free solder and silver.

The upper second surface-treated layer 171 is formed above the upper second circuit layer 155. The upper second surface-treated layer 171 is formed on an upper surface of the upper second circuit layer 155 that is exposed to the outside by the upper second protective layer 161. Similarly, the lower second surface-treated layer 171 is formed on a lower surface of the lower second circuit layer 155 that is exposed to the outside by the lower second protective layer 161. The second surface-treated layers 171 function to protect the second circuit layers 155 from the outside environment. Moreover, the second surface-treated layers 171 prevent the second circuit layers 155 from being oxidized and corroded.

The second surface-treated layers 171 may include at least one of organic solderability preservatives (OSP), electroless nickel immersion gold (ENIG), nickel, palladium, gold, tin, lead-free solder and silver. Moreover, the second surface-treated layers 171 may be constructed of any other material known in the field of circuit boards that is capable of protecting an exposed circuit layer. Moreover, in case the second circuit layers 155 having the second surface-treated layers 171 formed thereon need to be electrically connected with an outside component, the second surface-treated layers 171 may be constructed of a conductive material among the above-described materials.

The first protective layer 131 is formed above the upper first insulating layer 121 in the cavity 157. The first protective layer 131 is formed to surround and protect the portion of the upper first circuit layer 125 that is disposed in the cavity 157. Moreover, the first protective layer 131 is formed to surround lateral surfaces and a portion of an upper surface of the connection pads 127 and to expose an upper surface of the first surface-treated layer 141 to the outside. The first protective layer 131 is configured to protect the upper first circuit layer 125 around the connection pads 127 when soldering is performed for electrical connection between an external component (not shown) and the connection pads 127. Moreover, the first protective layer 131 prevents the upper first circuit layer 125 from being oxidized and corroded by being exposed to the outside.

The upper second protective layer 161 is formed above the upper second insulating layer 151 to surround and protect the upper second circuit layer 155. In this example, the upper second protective layer 161 is formed such that an upper surface of the upper second surface-treated layer 171 is exposed to the outside. When the external component (not shown) and the upper second circuit layer 155 are electrically connected with each other, the upper second protective layer 161 protects other portions of the upper second circuit layer 155 that are adjacent to the portions second circuit layer 155 that is connected with the external component.

The lower second protective layer 161 is formed below the lower second insulating layer 151 to surround and protect the lower second circuit layer 155. The lower second protective layer 161 is formed such that a lower surface of the lower second surface-treated layer 171 is exposed to the outside.

Moreover, the second protective layers 161 prevent the second circuit layers 155 from being oxidized and corroded by being exposed to the outside.

According to an embodiment, the first protective layers 131 and the second protective layers 161 are constructed of a heat-resistant coating material. For instance, the first protective layer 131 and the second protective layers 161 are made of a solder resist.

The printed circuit board includes upper and lower second vias 156 that are formed inside the insulating layer 180 and electrically connect the upper and lower first circuit layers 125 with the respective upper and lower second circuit layers 155. Moreover, it is possible that other vias make an electrical connection between other circuit layers, including any circuit layer not illustrated herein, formed in the printed circuit board 100. According to an embodiment, the vias may be constructed of a conductive material known in the field of circuit board.

Figure 2:
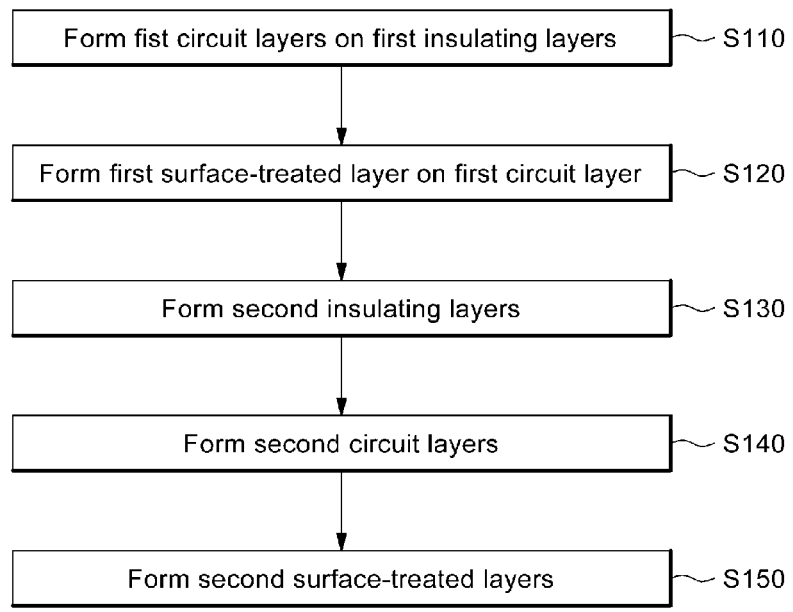
FIG. 2 is a flow diagram illustrating an example of a method of manufacturing the printed circuit board of FIG. 1.

FIG. 2 is a flow diagram illustrating a method of manufacturing the printed circuit board 100 in accordance with an embodiment, and FIGS. 3-21 are cross-sectional views illustrating processes performed in an example of the method of manufacturing the printed circuit board 100.

The flow diagram shown in FIG. 2 of the method of manufacturing the printed circuit board 100 will be described hereinafter with reference to FIG. 3 through FIG. 21.

Referring to FIGS. 3-7, the first circuit layers 125 are formed on the first insulating layers 121 (operation S110 in FIG. 2).

Figure 3:
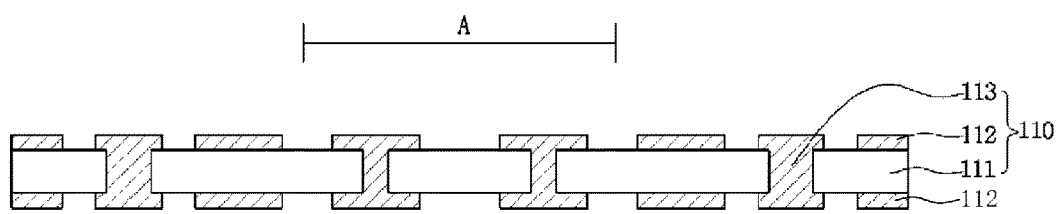
FIGS. 3-21 are cross-sectional views illustrating example processes used in the method of manufacturing the printed circuit board of FIG. 1.

Referring to FIG. 3, a core board 110 is formed first.

The core board 110 has upper and lower inner circuit layers 112 formed on the core insulating layer 111.

According to an embodiment, the core insulating layer 111 is constructed of a composite polymer resin that is commonly used for an interlayer insulating material. For instance, the core insulating layer 111 is made of an epoxy resin, for example, a prepreg, an ajinomoto build-up film (ABF), flame retardant 4 (FR-4) or bismaleimide triazine (BT). However, the material forming the core insulating layer 111 is not restricted to what is described herein and may be selected among insulating materials known in the field of circuit boards.

The upper and lower inner circuit layers 112 are respectively formed above and below the core insulating layer 111. The inner circuit layers 112 are constructed of a conductive material. For instance, the inner circuit layer 112 may be constructed of copper, or another conductive material known in the field of circuit boards.

The core board 110 further includes a through-via 113 formed to penetrate the core insulating layer 111. The through-via 113 electrically connects the upper inner circuit layer 112 with the lower inner circuit layer 112.

The core board 110 may be formed using any method known in the field of circuit boards. For instance, it is possible to form the core board 110 by applying one of a tenting method, a semi additive process (SAP) and a modified semi additive process (MSAP).

Figure 4:
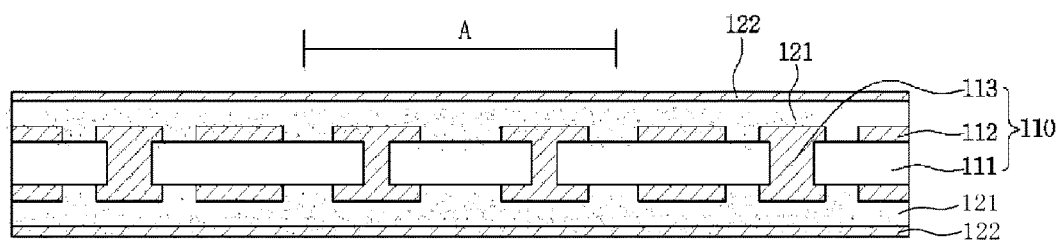

Referring to FIG. 4, the upper and lower first insulating layers 121 are respectively formed above and below the core board 110.

According to an embodiment, the upper first insulating layer 121 is laminated above the core insulating layer 111 while having an upper first metal layer 122 formed above the upper first insulating layer 121. Moreover, the lower first insulating layer 121 is laminated below the core insulating layer 111 while having a lower first metal layer 122 formed below the lower first insulating layer 121. Accordingly, the first insulating layers 121 are formed to embed the upper and lower inner circuit layers 112 formed, respectively, above and below the core insulating layer 111.

According to an embodiment, the first insulating layers 121 are constructed of a composite polymer resin that is commonly used for an interlayer insulating material. For instance, the first insulating layers 121 are made of an epoxy resin, for example, a prepreg, an ajinomoto build-up film (ABF), flame retardant 4 (FR-4) or bismaleimide triazine (BT). However, the material forming the first insulating layers 121 is not restricted to what is described herein and may be selected among insulating materials known in the field of circuit board.

The first metal layers 122 are constructed of a conductive metal. For instance, the first metal layers 122 are constructed of copper, or another conductive material known in the field of circuit boards.

Although it is described that the first insulating layers 121 having the first metal layers 122 formed thereon are laminated on the core board 110, this is merely an example and does not restrict the method of forming the first insulating layers 121. It is possible for anyone ordinarily skilled in the art to choose to laminate the first insulating layers 121 on the core board 110 while the first metal layers 122 are omitted.

Figure 5:
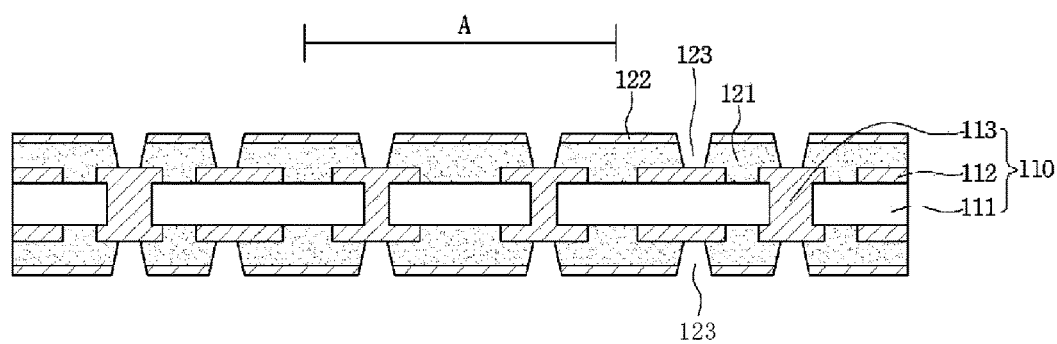

Referring to FIG. 5, upper and lower first via holes 123 are formed.

The upper and lower first via holes 123 formed above and below the upper and lower inner circuit layers 112, respectively, and are formed to penetrate the first insulating layers 121 and the first metal layers 122. Accordingly, a portion of the inner circuit layers 112 is exposed to an outside environment by the first via holes 123.

The first via holes 123 may be formed using a laser drill. Alternatively, the first via holes 123 may be formed using any method of processing a via hole known in the field of circuit boards.

Figure 6:
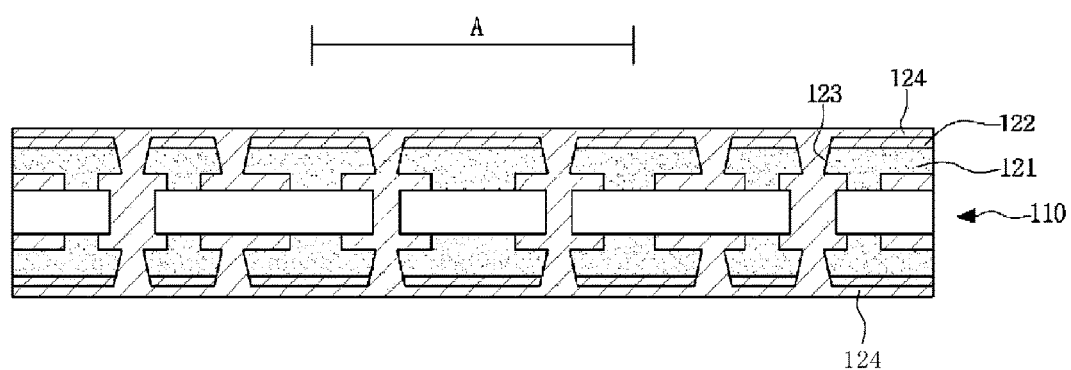

Referring to FIG. 6, upper and lower first plated layers 124 are formed in the first via hole 123 and above and below, respectively, the first metal layer 122, by performing electroplating. The first plated layers 124 are constructed of a conductive metal. For instance, the first plated layer 124 may be constructed of copper or another conductive material known in the field of circuit boards.

Figure 7:
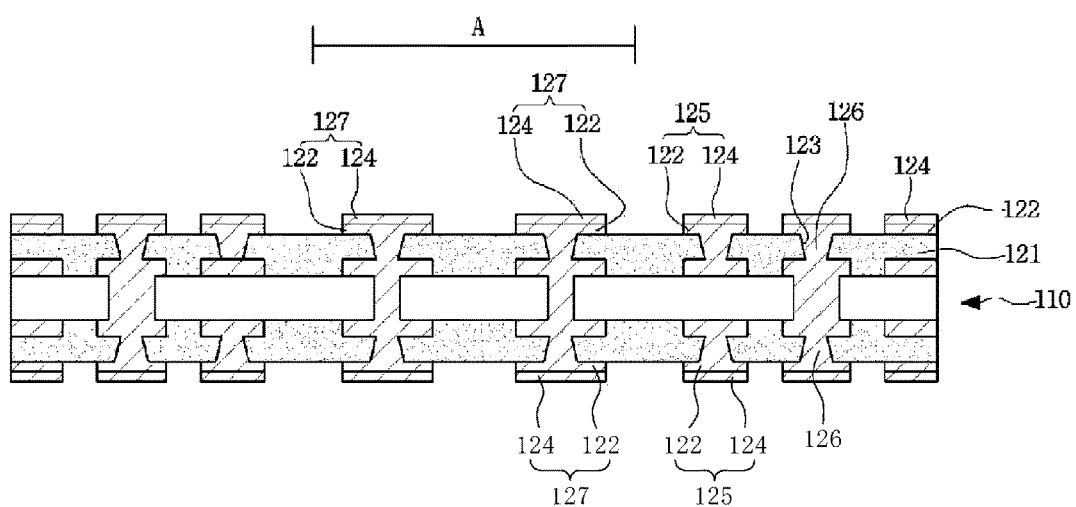

Referring to FIG. 7, upper and lower first circuit layers 125 and upper and lower first vias 126 are formed.

The first circuit layers 125 is formed by patterning the respective first plated layers 124 (shown in FIG. 6) and the respective first metal layers 122 (shown in FIG. 6). In this example, the first plated layers 124 formed inside the first via holes 123 form the first vias 126.

The upper first circuit layer 125 includes the connection pads 127 located in a cavity area A, which is an area where the cavity 157 (shown in FIG. 1) is to be formed later.

The first circuit layers 125 may be formed using a tenting method. However, the method of forming the first circuit layers 125 is not restricted to a tenting method, and it is possible to form the first circuit layers 125 using any method of forming a circuit layer known in the field of circuit board.

Hereinafter, the first circuit layers 125 will be illustrated without distinguishing the first circuit layers 125 into the respective first plated layers 124 and first metal layers 122.

Referring to FIGS. 8-11, a first surface-treated layer 141 is formed (operation S120 of FIG. 2).

Figure 8:
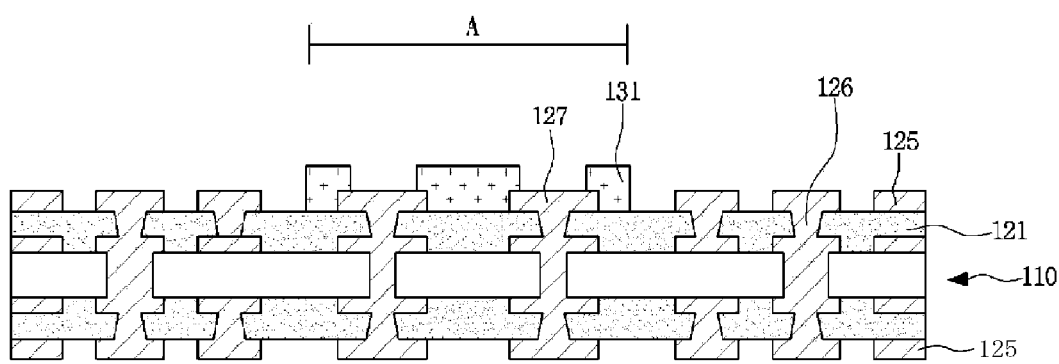

Referring to FIG. 8, a first protective layer 131 is formed in the cavity area A.

The first protective layer 131 is formed above the upper first insulating layer 121 in the cavity area A and to surround the upper first circuit layer 125. Moreover, the first protective layer 131 is formed in such a way that a portion of an upper surface of the connection pads 127 is exposed to the outside environment.

The first protective layer 131 formed as described above protects portions of the upper first circuit layer 125 around the connection pads 127 when soldering is performed for electrical connection between the electronic component (not shown) and the connection pads 127. Moreover, the first protective layer 131 prevents the upper first circuit layer 125 from being oxidized and corroded due to exposure to the outside.

According to an embodiment, the first protective layer 131 is made of a heat-resistant coating material. For instance, the first protective layer 131 may be made of a solder resist.

Figure 9:
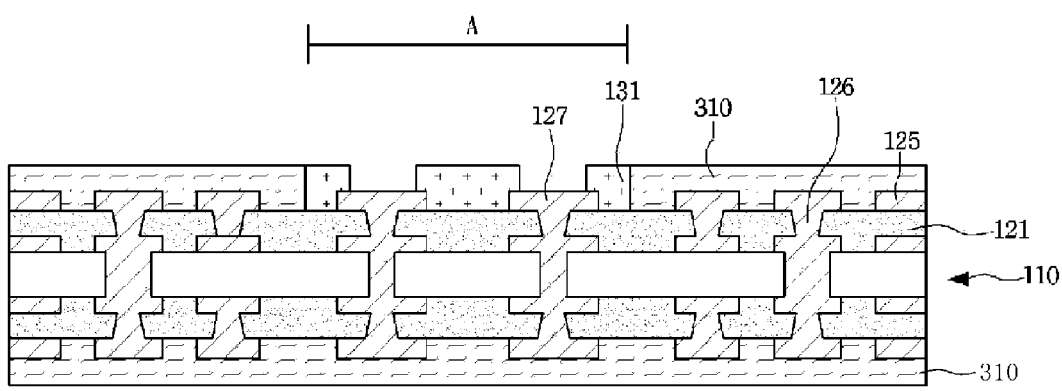

Referring to FIG. 9, upper and lower first plated resists 310 are respectively formed.

The upper first plated resist 310 is formed above the upper first insulating layer 121. The lower first plated resist 310 is formed below the lower first insulating layer 121. The first plated resists 310 are formed to protect the first circuit layers 125 from the outside by surrounding the first circuit layers 125. In this example, the upper first plated resist 310 is formed in an area excluding the cavity area A. Accordingly, as illustrated in FIG. 9, the upper first circuit layer 125 excluding the connection pads 127 is protected from the outside environment by the upper first plated resist 310 and the first protective layer 131. That is, only the upper surface of the connection pads 127 exposed to the outside by the first protective layer 131 remains to be exposed to the outside. The lower first circuit layer 125 is protected from the outside environment by the lower first plated resist 310.

According to an embodiment, the first plated resists 310 are constructed of a dry film. However, the material for the first plated resists 310 is not restricted to a dry film, and the first plated resists 310 may be made of any material for a plated resist known in the field of circuit patterns.

Figure 10:
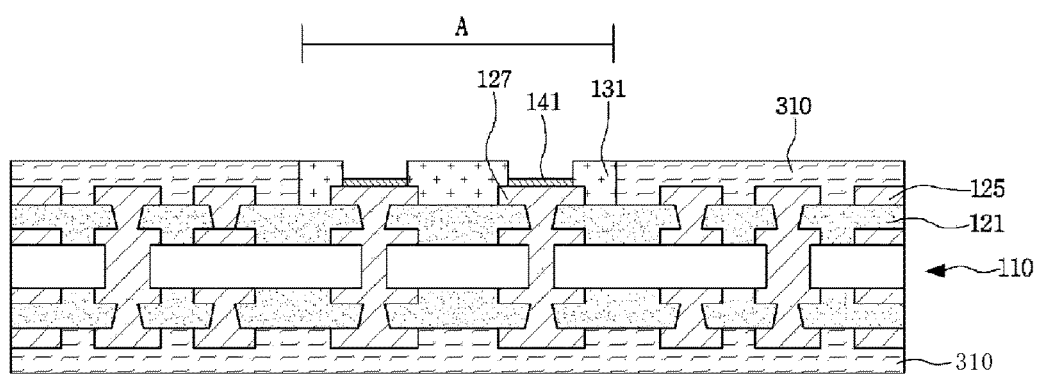

Referring to FIG. 10, the first surface-treated layer 141 is formed.

According to an embodiment, the first surface-treated layer 141 is formed on the upper surface of the connection pads 127 exposed to the outside.

According to an embodiment, the first surface-treated layer 141 is constructed of a material that is different from that of the upper second circuit layer 155 (shown in FIG. 1), which is to be formed later. Moreover, the first surface-treated layer 141 is constructed of a material that does not react with an etchant that reacts with the upper second circuit layer 155. For example, the first surface-treated layer 141 may include at least one of electroless nickel immersion gold (ENIG), nickel, palladium, gold, tin, lead-free solder and silver.

The first surface-treated layer 141 may be formed using any method of forming a surface-treated layer known in the field of circuit patterns.

The first surface-treated layer 141 functions to protect the connection pads 127 which are exposed to the outside environment. Since the connection pads 127 are protected by the first surface-treated layer 141, it is possible to skip the process of forming an additional etching preventing layer in the cavity area A. An etching preventing layer is an element formed to protect a circuit layer exposed to an outside from an etchant used in an etching process. That is, due to the formation of the first surface-treated layer 141, it is possible to omit a conventionally formed etching preventing layer.

Figure 11:
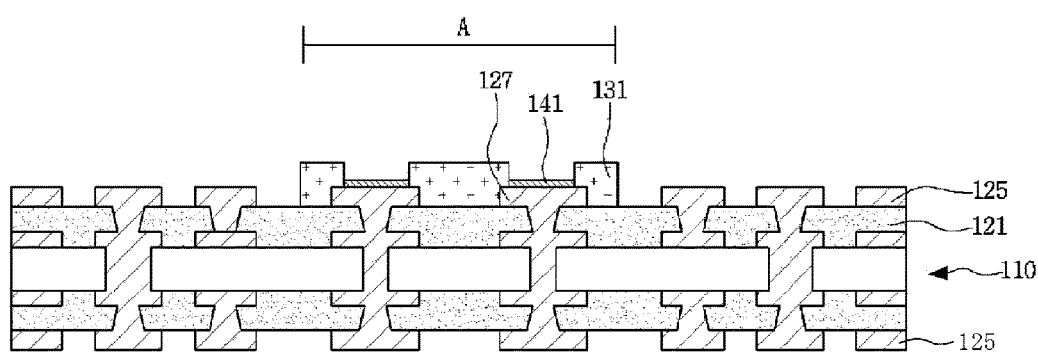

Referring to FIG. 11, the first plated resists 310 (shown in FIG. 10) are removed.

Figure 12:
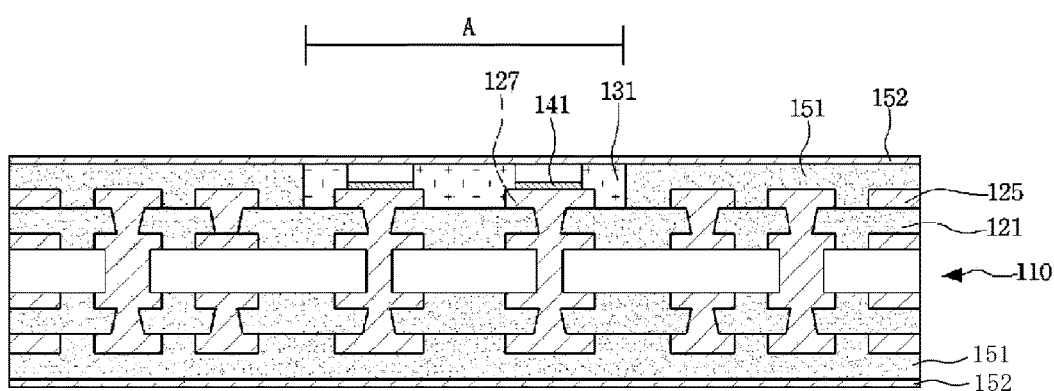

Referring to FIG. 12, upper and lower second insulating layers 151 are formed (operation S130 in FIG. 2).

The upper second insulating layer 151 is formed above the upper first insulating layer 121 while having the cavity 157 formed at a portion corresponding to the cavity area A. The lower second insulating layer 151 is formed below the lower first insulating layer 121. The second insulating layers 151 formed as described above embed the first circuit layers 125 formed at a portions excluding the cavity area A.

According to an embodiment, the upper second insulating layer 151 is laminated above the upper first insulating layer 121 while having an upper second metal layer 152 formed above the upper second insulating layer 151. The upper second metal layer 152 is formed above the entire upper second insulating layer 151 including the cavity 157. The lower second insulating layer 151 is laminated below the lower first insulating layer 121 while having a lower second metal layer 152 formed below the lower second insulating layer 151.

According to an embodiment, the second insulating layers 151 are constructed of a composite polymer resin that is commonly used for an interlayer insulating material. For instance, the second insulating layers 151 may be constructed of a no-flow prepreg.

According to an embodiment, the second metal layer 152 is made of a material that is used in the field of circuit boards but is different from that of the first surface-treated layer 141. For instance, the second metal layer 152 is made of copper.

Since the upper first surface-treated layer 141 is provided, an additional etching preventing layer is not formed in the cavity area A. Accordingly, when the upper second insulating layer 151 and the upper second metal layer 152 are laminated above the first insulating layer 121, it is possible to prevent the upper second metal layer 152 from being warped by an etching preventing layer and to prevent a level difference from occurring as a result of warpage. Therefore, processes to follow thereafter are carried out on the second insulating layers 151 and the second metal layers 152 that remain flat.

By forming the aforementioned upper second insulating layer 151 above the upper first insulating layer 121, the cavity 157 is formed. The first surface-treated layer 141 formed above the connection pads 127 is exposed to the outside environment by the cavity 157 formed as described above. Moreover, according to an embodiment, it is possible to adjust a depth of the cavity 157 by adjusting a thickness of the second insulating layer 151.

Referring to FIGS. 13-17, upper and lower second circuit layers 155 are formed (operation S140 in FIG. 2) using, for example, a tenting method.

Figure 13:
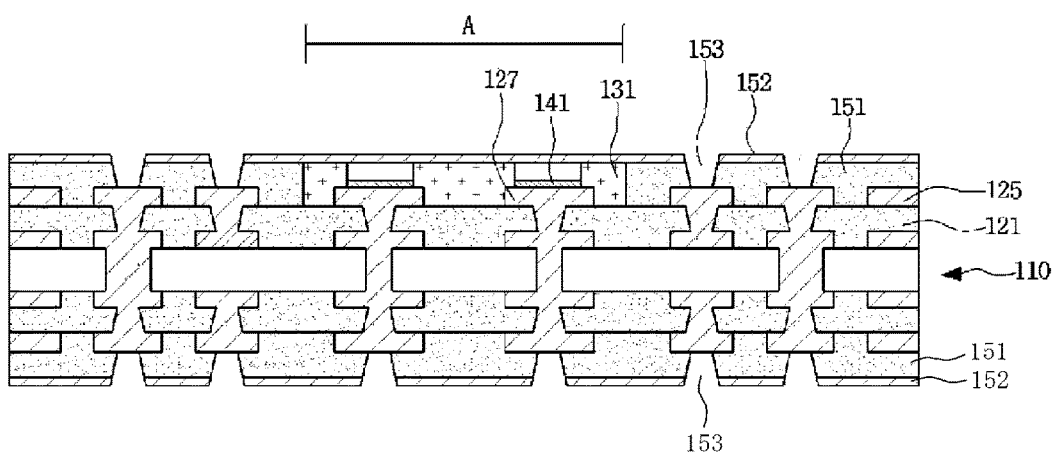

Referring to FIG. 13, upper and lower second via holes 153 are formed.

The upper second via holes 153 are formed to penetrate the upper second insulating layer 151 and the upper second metal layer 152. The lower second via holes 153 are formed to penetrate the lower second insulating layer 151 and the lower second metal layer 152. Accordingly, portions of the first circuit layers 125 are exposed to the outside environment by the second via holes 153.

The second via holes 153 may be formed using a laser drill. Alternatively, the second vias hole 153 may be formed using any other method of forming via holes known in the field of circuit boards.

Figure 14:
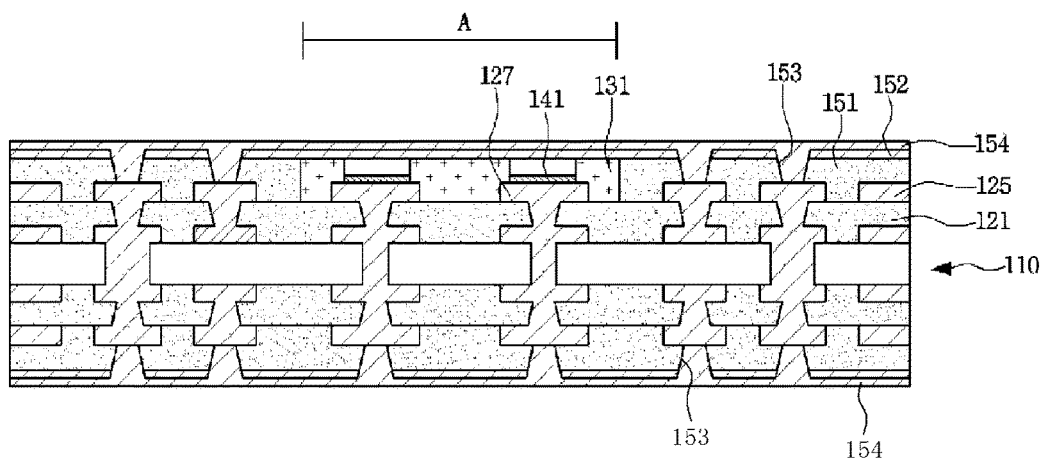

Referring to FIG. 14, upper and lower second plated layers 154 are formed, for example, by performing electroplating.

The upper second plated layer 154 is formed in the upper second via holes 153 and above the upper second metal layer 152. The lower second plated layer 154 is formed in the lower second via holes 153 and below the lower second metal layer 152. The second plated layers 154 are constructed of a material that is used in the field of circuit boards but is different from that of the first surface-treated layer 141. For instance, the second plated layer 154 may be constructed of copper.

Figure 15:
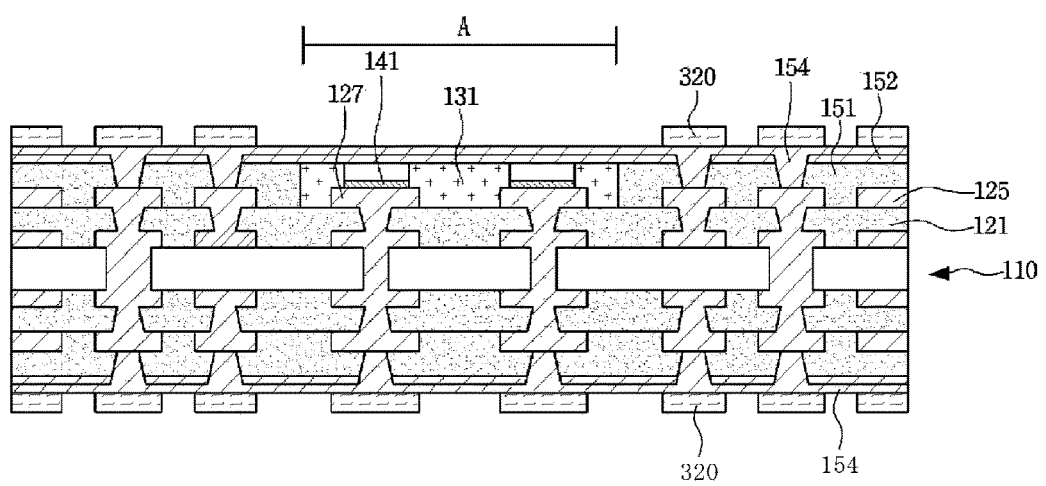

Referring to FIG. 15, upper and lower etching resists 320 are formed. The upper etching resist 320 is formed above the upper second plated layer 154. The lower etching resist 320 is formed below the lower second plated layer 154.

The upper and lower etching resists 320 are patterned such that portions of the respective upper and lower second plated layers 154 to be removed are exposed to the outside. That is, the etching resists 320 are formed to cover portions corresponding to the second circuit layers 155 (shown in FIG. 1) to be formed later in the second plated layers 154 and to expose remaining portions of the second plated layers 154 to the outside.

Figure 16:
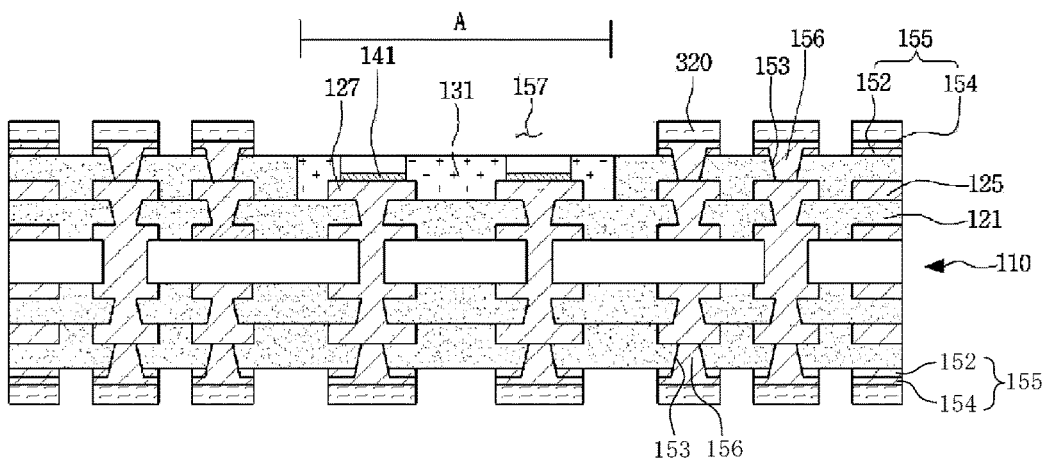

Referring to FIG. 16, upper and lower second circuit layers 155 and upper and lower second vias 156 are formed. According to an embodiment, an etching process is performed using an etchant. In the etching process, the second plated layers 154 exposed to the outside environment by the etching resist 320 are removed by reacting with the etchant. In such a case, the portions of the upper second metal layer 152 located below the portions of the upper second plated layer 154 removed by the etchant and the portions of the lower second metal layer 152 located above the portions of the lower second plated layer 154 removed by the etchant are also removed. The cavity 157 may be formed by the etching process through which the second plated layers 154 and the second metal layers 152 are removed.

According to an embodiment, the etchant used for removing the second plated layers 154 and the second metal layers 152 does not react with the first surface-treated layer 141. In other words, the first surface-treated layer 141 is not removed when the portions of the second plated layers 154 and the portions of second metal layer 152 above the cavity 157 are removed by the etchant. Therefore, the connection pads 127 in the cavity area A are protected by the first surface-treated layer 141 from the etchant during the etching process even though there is no additional etching preventing layer.

The second plated layers 154 and the second metal layers 152 are patterned through the etching process to form the second circuit layers 155. Moreover, the second plated layers 154 formed inside the second via holes 153 become the second vias 156.

Figure 17:
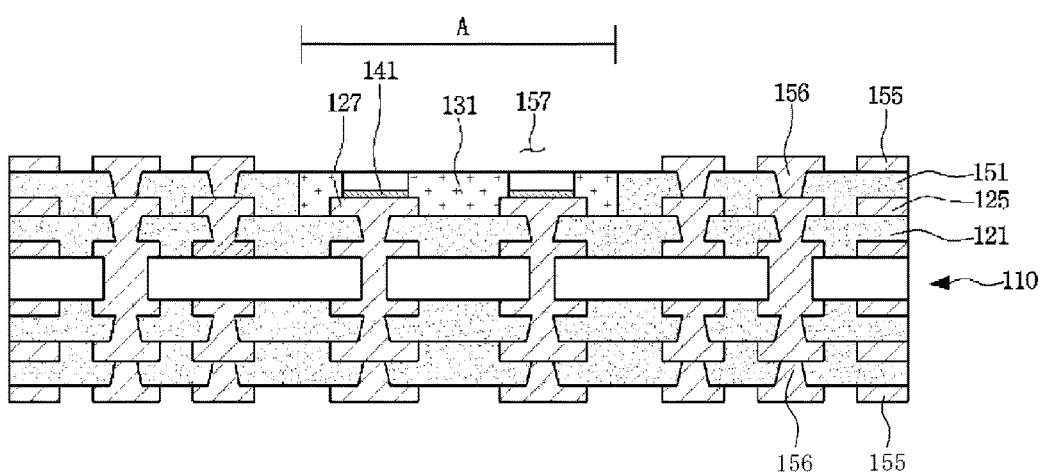

Referring to FIG. 17, the etching resist 320 (shown in FIG. 16) is removed.

Referring to FIGS. 18-21, upper and lower second surface-treated layers 171 are formed (operation S150 in FIG. 2).

Figure 18:
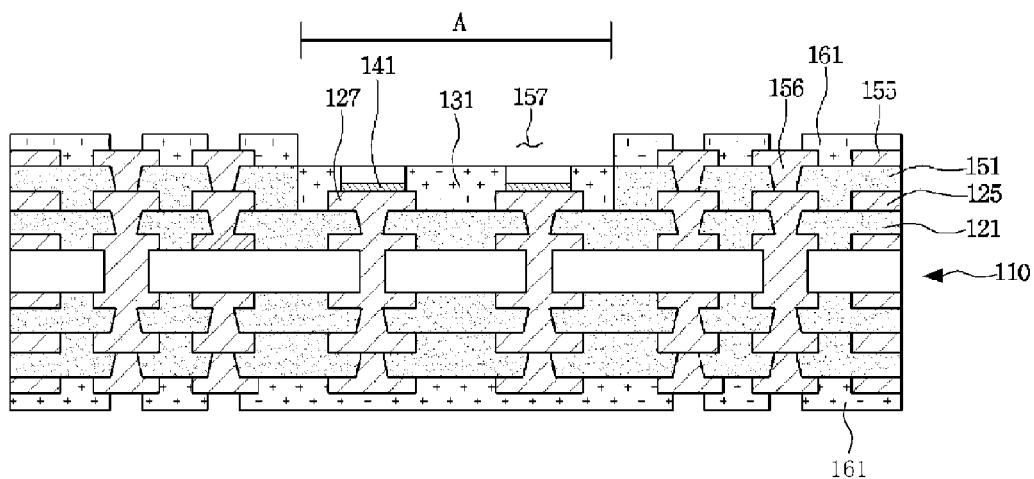

Referring to FIG. 18, upper and lower second protective layers 161 are formed. The upper second protective layer 161 is formed above the upper second insulating layer 151 and to surround the upper second circuit layer 155. The lower second protective layer 161 is formed below the lower second insulating layer 151 and to surround the lower second circuit layer 155. Moreover, the second protective layers 161 are formed in such a way that portions of the upper second circuit layer 155 that need to be electrically connected with an external component (not shown) are exposed to the outside environment.

When the external component (not shown) and the upper second circuit layer 155 are electrically connected with each other, the upper second protective layer 161 formed as described above protects portions of the upper second circuit layer 155 that are adjacent to portions of the upper second circuit layer 155 that are electrically connected with the external component. Moreover, the second protective layers 161 prevent the second circuit layers 155 from being oxidized and corroded due to exposure to the outside environment.

According to an embodiment, the second protective layer 161 is constructed of a heat-resistant coating material. For instance, the second protective layer 161 may be constructed of a solder resist.

Although it is only described and illustrated that the first circuit layers 125 and the second circuit layers 155 are formed, it is also possible that one or more additional circuit layers are formed between the respective first circuit layers 125 and second circuit layers 155.

According to an embodiment, it is possible to adjust the depth of the cavity 157 by adjusting the thickness of the upper second insulating layer 151. Moreover, the depth of the cavity 157 may be also adjusted using thicknesses of the upper second insulating layer 151, the upper second protective layer 161 and an element between the upper second insulating layer 151 and the upper second protective layer 161.

Figure 19:
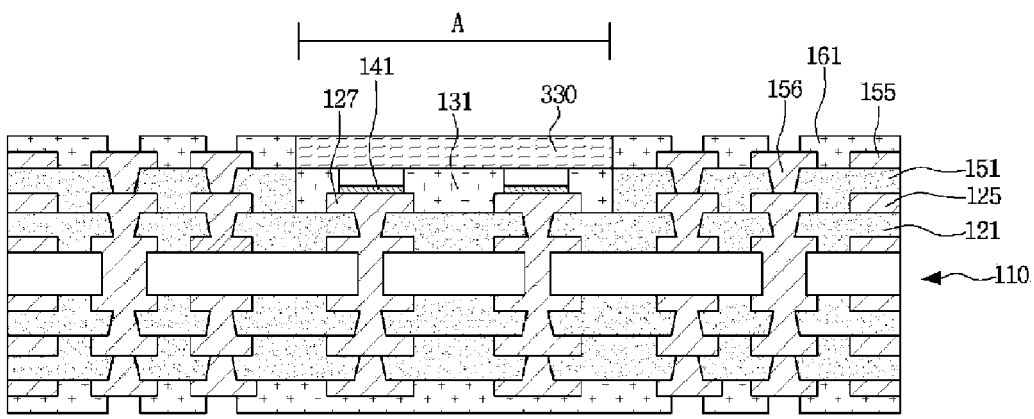

Referring to FIG. 19, a second plated resist 330 is formed in the cavity 157. The second plated resist 330 protects the first surface-treated layer 141 from the outside environment. The second plated resist 330 formed as described above allows only an upper surface of the upper second circuit layer 155 exposed by the upper second protective layer 161 to be exposed to the outside environment.

According to an embodiment, the second plated resist 330 is constructed of a dry film. However, the material for the second plated resist 330 is not restricted to the dry film, and the second plated resist 330 may be constructed of any material for a plated resist known in the field of circuit patterns.

Figure 20:
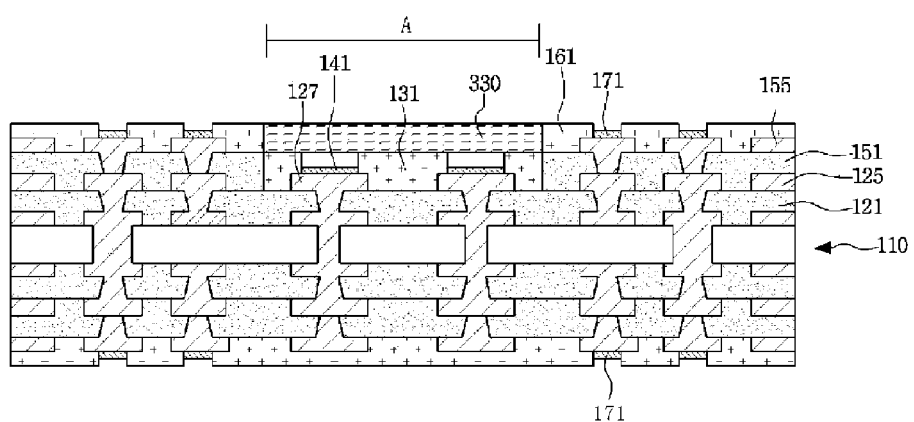

Referring to FIG. 20, upper and lower second surface-treated layers 171 are formed. The upper second surface-treated layer 171 is formed on the portions of the upper surface of the upper second circuit layer 155 that are exposed to the outside environment by the upper second protective layer 161. The lower second surface-treated layer 171 is formed on the portions of the lower surface of the lower second circuit layer 155 that are exposed to the outside environment by the lower second protective layer 161.

The second surface-treated layers 171 may include at least one of organic solderability preservatives (OSP), electroless nickel immersion gold (ENIG), nickel, palladium, gold, tin, lead-free solder, and silver. Alternatively, the second surface-treated layer 171 may be constructed of any other material known in the field of circuit boards that is capable of protecting an exposed circuit layer. Moreover, in case the second circuit layers 155 having the second surface-treated layers 171 formed thereon need to be electrically connected with an outside element, the second surface-treated layers 171 may be constructed of a conductive material among the above-described materials.

According to an embodiment, it is possible to allow the second surface-treated layer 171 to be selectively formed at required portions only, by the second plated resist 330.

Figure 21:
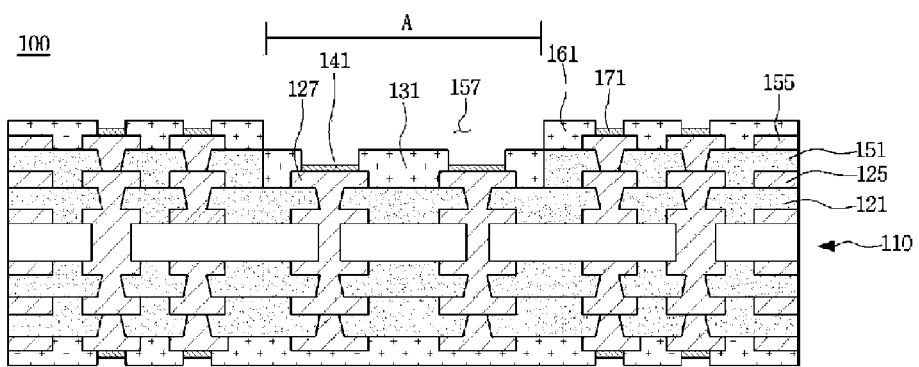

Referring to FIG. 21, the second plated resist 330 is removed.

The printed circuit board 100 is formed through the processes described with reference to FIG. 2 to FIG. 21. According to the method of manufacturing the printed circuit board 100, it is possible to omit a conventional etching preventing layer for protecting a pre-formed circuit layer from an etchant when a new circuit layer is formed, owing to a surface-treated layer. Therefore, it is possible to prevent a level difference from occurring by the etching preventing layer. Moreover, since follow-up processes are carried out under a flat condition, without the level difference, it is possible to prevent the conventional problems related to the level difference caused by the etching preventing layer, such as a defective cavity size, a trace of etching preventing layer and a defective circuit layer. Moreover, since the processes of forming the etching preventing layer and removing the etching preventing layer may be omitted, it is possible to simplify and save time and costs for the processes required for the method of manufacturing a printed circuit board.

Figure 22:
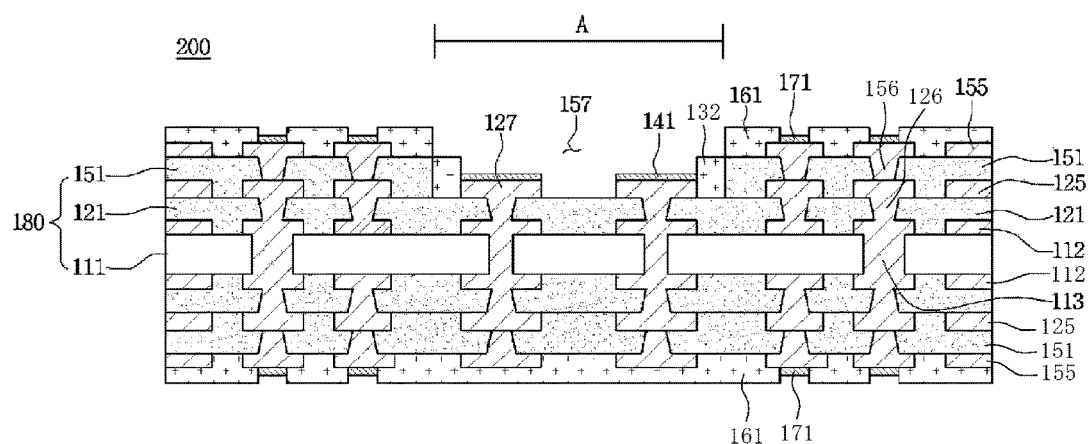
FIG. 22 illustrates another example of a printed circuit board.

FIG. 22 illustrates an example of a printed circuit board 200 according to another embodiment.

Referring to FIG. 22, the printed circuit board 200 includes the insulating layer 180, the inner circuit layers 112, the first circuit layers 125, the second circuit layers 155, the first surface-treated layer 141, the second surface-treated layers 171, a first protective layer 132 and the second protective layers 161.

Hereinafter, elements of the printed circuit board that are different from the elements of the printed circuit board 100 will be primarily described. Therefore, the elements of the printed circuit board 200 that are identical with those of the printed circuit board 100 will not be redundantly described, and the elements of which the descriptions are omitted are referenced above with respect to FIG. 1.

The first protective layer 132 of the printed circuit board 200 is formed between the connection pads 127 and the upper second insulating layer 151. That is, the first protective layer 132 is formed between a lateral surface of the second insulating layer 151 and a lateral surface of the connection pads 127, and does not cover any of the upper surface of the upper first circuit layer 125. As the first protective layer 132 is formed as described above, the first surface-treated layer 141 is formed on an entire upper surface of the connection pads 127.

FIGS. 23-26 are cross-sectional views illustrating processes used in an example of a method of manufacturing the printed circuit board.

Figure 23:
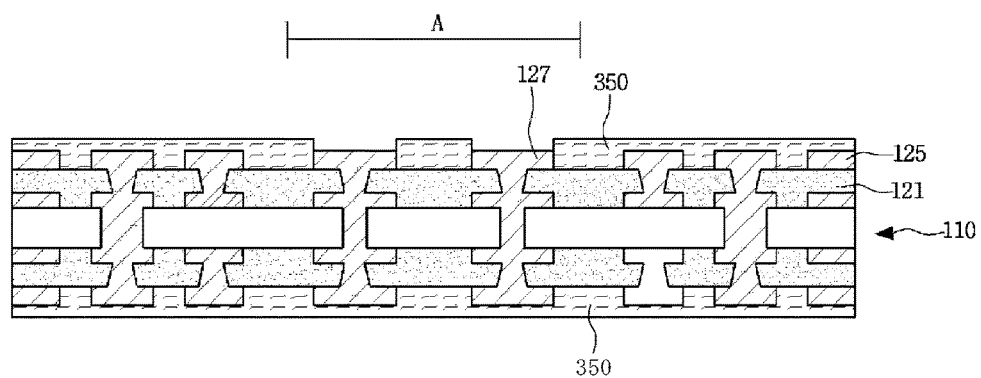
FIG. 23 through FIG. 26 are cross-sectional views illustrating example processes used in a method of manufacturing the printed circuit board of FIG. 22.

Referring to FIG. 23, upper and lower first plated resists 350 are formed on the core board 110.

The core board 110 may be formed through the same processes described with reference to FIGS. 3-7. Accordingly, the descriptions of these processes will not be redundantly provided herein.

The upper first plated resist 350 is formed above the upper first insulated layer 121. The upper first plated resist 350 is formed to protect the upper first circuit layer 125, excluding the connection pads 127, from the outside environment. Accordingly, the upper first plated resist 350 is formed such that the entire upper surface of the connection pads 127 is exposed to the outside environment. In addition, the lower first plated resist 350 is formed below the lower first insulated layer 121. Accordingly, the lower first plated resist 350 is formed to protect the lower first circuit layer 125 formed on the lower first insulating layer 121 from the outside environment.

According to an embodiment, the first plated resist 350 is constructed of a dry film. However, the material for the first plated resist 350 is not restricted to a dry film, and the first plated resist 350 may be constructed of any material for a plated resist known in the field of circuit patterns.

Figure 24:
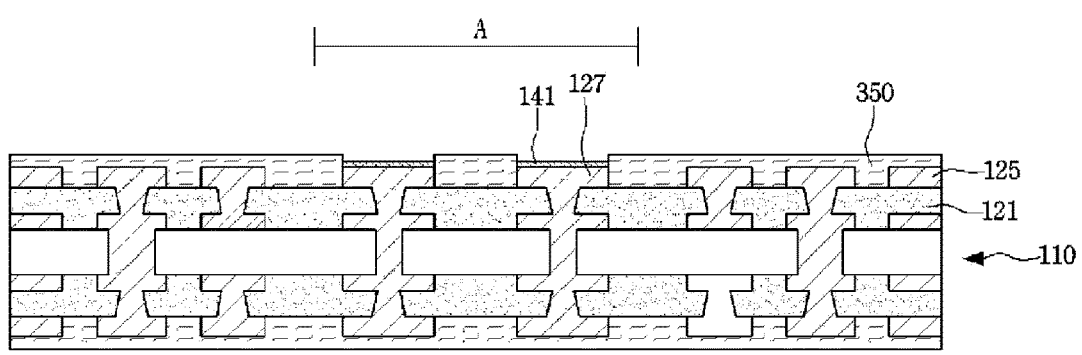

Referring to FIG. 24, the first surface-treated layer 141 is formed on the upper surface of the connection pads 127 that is exposed to the outside environment by the upper first plated resist 350. That is, the first surface-treated layer 141 is formed on the entire upper surface of the connection pads 127.

According to an embodiment, the first surface-treated layer 141 is constructed of a material that is different from that of the upper second circuit layer 155 (shown in FIG. 22), which is to be formed later. Moreover, the first surface-treated layer 141 is made of a material that does not react with an etchant that reacts with the upper second circuit layer 155. For example, the first surface-treated layer 141 may include at least one of electroless nickel immersion gold (ENIG), nickel, palladium, gold, tin, lead-free solder and silver. The first surface-treated layer 141 may be formed using any method of forming a surface-treated layer known in the field of circuit patterns.

Figure 25:
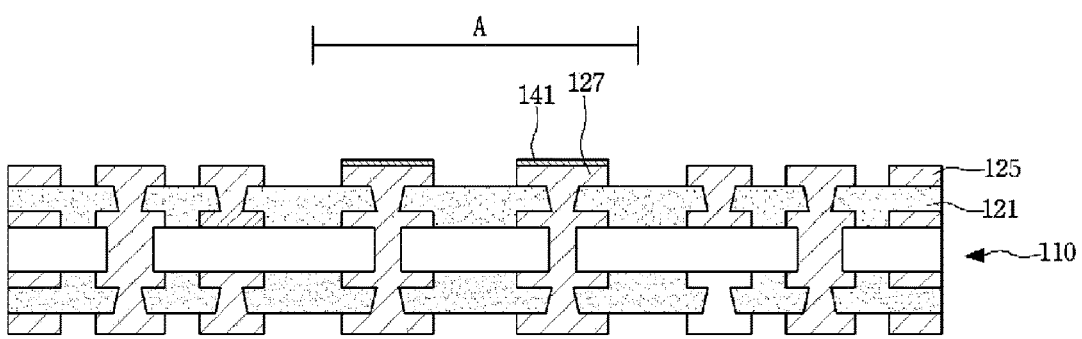

Referring to FIG. 25, the first plated resists 350 (shown in FIG. 24) are removed.

Figure 26:
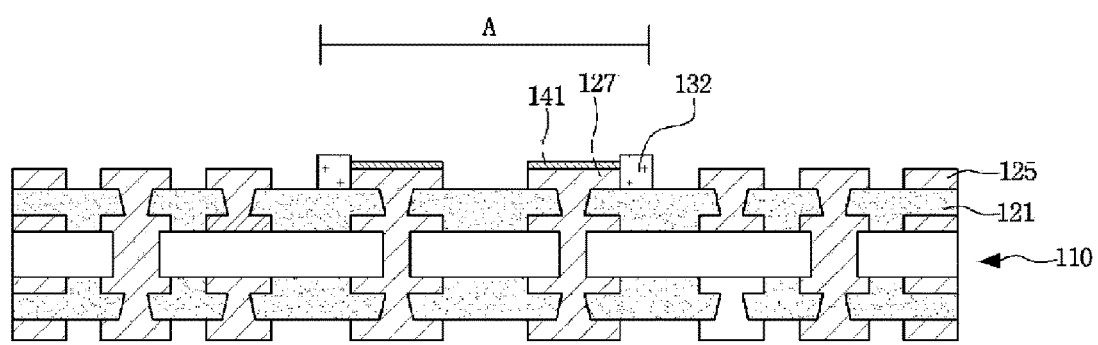

Referring to FIG. 26, the first protective layer 132 is formed in the cavity area A. Moreover, the first protective layer 132 is formed between the lateral surfaces of the connection pads 127 and a boundary of the cavity area A. That is, the first protective layer 132 is formed in the shape of a dam that surrounds the connection pads 127. The first protective layer 132 formed as described above prevents the upper second insulating layer 151 (shown in FIG. 22) from flowing into the cavity area A due to heating and compressing when the upper second insulating layer 151 is formed later on the upper first insulating layer 121.

Afterwards, the processes for forming the second insulating layers 151 (shown in FIG. 22), the second circuit layers 155 (shown in FIG. 22), the second protective layers 161 (shown in FIG. 22) and the second surface-treated layers 171 (shown in FIG. 22) are identical to those described with reference to FIGS. 12-21.

Through the processes described above, the printed circuit board 200 (shown in FIG. 22) is formed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a first insulating layer;
   a first circuit layer formed on the first insulating layer;
   a first surface-treated layer formed on the first circuit layer;
   a first protective layer formed partially on the first insulating layer and covering the first circuit layer, and exposing the first surface-treated layer;
   a second insulating layer formed on the first insulating layer and connected to the first protective layer to form a same layer, wherein a height of the second insulating layer and a height of the first protective layer are substantially the same; and
   a second protective layer formed on the second insulating layer, and forming a cavity exposing the first protective layer.

2. The printed circuit board of claim 1, wherein the first surface-treated layer is constructed of a material that does not react with an etchant that reacts with the second circuit layer.

3. The printed circuit board of claim 1, further comprising:
   a second circuit layer formed on the second insulating layer; and
   a second surface-treated layer formed on the second circuit layer,
   wherein the second protective layer covers the second circuit layer and exposes the second surface-treated layer.

4. The printed circuit board of claim 1, wherein a portion of the first circuit layer disposed in the cavity forms connection pads configured to be electrically connected with an electronic component to be mounted thereon.

* * * * *